United States Patent
Krueger et al.

(10) Patent No.: US 9,952,296 B2
(45) Date of Patent: Apr. 24, 2018

(54) MAGNETIC RESONANCE SAFETY MONITORING SYSTEMS AND METHODS

(75) Inventors: Sascha Krueger, Hamburg (DE); Daniel Wirtz, Hamburg (DE); Steffen Weiss, Hamburg (DE)

(73) Assignee: KONINKLIJKE PHILIP N.V., Eindhoven (NL)

( * ) Notice: Subject to any disclaimer, the term of this patent is extended or adjusted under 35 U.S.C. 154(b) by 451 days.

(21) Appl. No.: 12/808,404

(22) PCT Filed: Dec. 22, 2008

(86) PCT No.: PCT/IB2008/055482
§ 371 (c)(1),
(2), (4) Date: Jun. 16, 2010

(87) PCT Pub. No.: WO2009/081379
PCT Pub. Date: Jul. 2, 2009

(65) Prior Publication Data
US 2010/0312091 A1    Dec. 9, 2010

(30) Foreign Application Priority Data

Dec. 21, 2007  (EP) .................................. 07123950

(51) Int. Cl.
*A61B 5/055*   (2006.01)
*G08B 23/00*   (2006.01)
*G01R 33/28*   (2006.01)

(52) U.S. Cl.
CPC .......... *G01R 33/285* (2013.01); *G01R 33/288* (2013.01)

(58) Field of Classification Search
CPC combination set(s) only.
See application file for complete search history.

(56) References Cited

U.S. PATENT DOCUMENTS

| 5,730,134 A | 3/1998 | Dumoulin |
| 6,272,370 B1 * | 8/2001 | Gillies .............. A61M 25/0127 324/309 |

(Continued)

FOREIGN PATENT DOCUMENTS

| EP | 1314995 A2 | 5/2003 |
| EP | 1314995 A3 | 4/2004 |

(Continued)

OTHER PUBLICATIONS

F. Hebrank et al. Parallel Transmission (pTX) Technology* MR Imaging With an 8-Channel Transmit Array; Technology; Magnetom Flash; Jan. 2007; www.siemens.com/magnetom-world; pp. 75-79.

(Continued)

*Primary Examiner* — Serkan Akar
*Assistant Examiner* — Farshad Negarestan

(57) ABSTRACT

A magnetic resonance method comprises applying a radio frequency excitation in an examination region (14), measuring a magnetic resonance signal generated by the applied radio frequency excitation in a subject (16) in the examination region, monitoring a radio frequency parameter during the applying, and evaluating subject safety based on the monitoring. A magnetic resonance safety monitor (40) comprises an analyzer (42, 44, 46, 50) configured to (i) receive a radio frequency signal during magnetic resonance excitation, (ii) extract a radio frequency parameter from the received radio frequency signal, and (iii) evaluate subject safety based on the extracted radio frequency parameter, and a remediation module (54) configured to perform a remediation of the magnetic resonance excitation responsive to the evaluation (iii) indicating a potentially unsafe condition.

9 Claims, 4 Drawing Sheets

(56) References Cited

U.S. PATENT DOCUMENTS

| | | | |
|---|---|---|---|
| 6,374,132 B1* | 4/2002 | Acker et al. | 600/411 |
| 6,426,623 B1* | 7/2002 | Bernstein | 324/314 |
| 6,516,211 B1* | 2/2003 | Acker et al. | 600/411 |
| 6,606,513 B2* | 8/2003 | Lardo et al. | 600/411 |
| 6,768,917 B1* | 7/2004 | Van Vaals | 600/424 |
| 6,773,408 B1* | 8/2004 | Acker et al. | 601/2 |
| 6,898,454 B2* | 5/2005 | Atalar et al. | 600/410 |
| 7,123,010 B2* | 10/2006 | Krockel | 324/318 |
| 7,205,768 B2 | 4/2007 | Schulz | |
| 2002/0040185 A1* | 4/2002 | Atalar et al. | 600/423 |
| 2002/0093336 A1* | 7/2002 | Bernstein | 324/309 |
| 2003/0028095 A1* | 2/2003 | Tulley et al. | 600/422 |
| 2004/0150401 A1* | 8/2004 | Eberler et al. | 324/318 |
| 2004/0175294 A1* | 9/2004 | Ellison | C12M 35/02 422/68.1 |
| 2004/0199069 A1* | 10/2004 | Connelly | G01R 33/285 600/412 |
| 2004/0199070 A1* | 10/2004 | Krockel | 600/412 |
| 2005/0116712 A1 | 6/2005 | Corver et al. | |
| 2006/0030772 A1* | 2/2006 | Hyde et al. | 600/424 |
| 2006/0122493 A1* | 6/2006 | Atalar et al. | 600/423 |
| 2006/0173285 A1* | 8/2006 | Mallozzi et al. | 600/422 |
| 2006/0287596 A1* | 12/2006 | Johnson et al. | 600/437 |
| 2007/0016003 A1* | 1/2007 | Piron et al. | 600/415 |
| 2007/0043288 A1* | 2/2007 | Mueller | 600/411 |
| 2007/0106148 A1* | 5/2007 | Dumoulin | 600/410 |
| 2007/0167725 A1* | 7/2007 | Tropp et al. | 600/410 |
| 2007/0201178 A1* | 8/2007 | Reykowski | 361/119 |
| 2007/0241753 A1* | 10/2007 | Sodickson et al. | 324/307 |
| 2008/0182524 A1* | 7/2008 | Graesslin et al. | 455/73 |
| 2008/0211501 A1* | 9/2008 | Graesslin et al. | 324/318 |

FOREIGN PATENT DOCUMENTS

| | | |
|---|---|---|
| JP | 5237072 | 5/1993 |
| JP | 05-237078 | 9/1993 |
| JP | 05237078 A | 9/1993 |
| JP | 2005-021688 | 1/2005 |
| JP | 2006503634 A | 2/2006 |
| WO | 2004061469 A1 | 7/2004 |
| WO | 2005001502 A1 | 1/2005 |
| WO | 2005106520 A1 | 11/2005 |

OTHER PUBLICATIONS

S. Krueger et al. "Permanent Non-Invasive Device Safety Monitoring for Clinical MRI" Proc. Intl. Soc. Mag. Reson. Med 2009; p. 896.

I. Graesslin et al. "Real-Time SAR Monitoring to Ensure Patient Safety for Parallel Transmission Systems" Proc. Intl. Soc. Mag. Reson Med; May 2007; p. 1086.

* cited by examiner

MAGNETIC RESONANCE SAFETY MONITORING SYSTEMS AND METHODS

FIELD OF THE INVENTION

The following relates to the magnetic resonance arts. The following finds illustrative application to magnetic resonance imaging and spectroscopy, and is described with particular reference thereto. However, the following will find application in other magnetic resonance applications as well.

BACKGROUND OF THE INVENTION

Magnetic resonance imaging and spectroscopy are known techniques for diagnosing, monitoring, researching, or otherwise characterizing various types of conditions in humans, animals (e.g., pets or clinical research subjects), cadavers, archaeological subjects, and so forth. In such cases, the subject is typically of substantial value, and the magnetic resonance techniques are advantageous as they are deemed to be unlikely to cause injury or damage to the subject.

While magnetic resonance is indeed a generally safe and non-damaging technique, problems can arise if the subject includes or is associated with an electrically conductive object, component, or other element. In such a case, radio frequency excitation used in magnetic resonance can couple with the electrically conductive element so as to cause heating, local electrical discharge, or other adverse effect that can injure or damage the subject. For example, in interventional magnetic resonance, a catheter or other interventional instrument is inserted into a human or animal subject. If the interventional instrument includes metal wires or other conductive components, these can couple with the radio frequency signal output by the transmit coil during magnetic resonance excitation. Likewise, implanted pacemaker wires, orthopedic implants, sensors, or other electrically conductive foreign objects disposed in or on a human or animal subject can cause problems. In forensic magnetic resonance entailing examination of a cadaver, archaeological artifact, or the like, the makeup of the subject may be unknown prior to examination, and an unexpected electrically conductive component hidden inside of a cadaver, Egyptian mummy or the like can cause substantial damage due to heating or other effects of the radio frequency coupling.

The likelihood of damage is enhanced dramatically if the electrically conductive element has a natural resonance frequency at or near the magnetic resonance frequency. In such cases, coupling of the electrically conductive element with the radio frequency signal used in magnetic resonance excitation is dramatically enhanced by natural resonance. The natural resonance frequency of an element can be affected by a wide range of factors. For example, the natural resonance frequency of an interventional instrument can change in response to how the physician holds the instrument, or in response to contact between the instrument and the subject as the interventional instrument is inserted into and moved within the subject, or so forth. In sum, there are numerous situations in which a known or unknown electrically conductive object can unexpectedly couple with the magnetic resonance excitation, possibly in a naturally resonant fashion, so as to lead to excessive heating or other damage to the subject.

SUMMARY OF THE INVENTION

In accordance with certain illustrative embodiments shown and described as examples herein, a magnetic resonance safety method is disclosed, comprising: receiving a radio frequency signal during magnetic resonance excitation; extracting a radio frequency parameter from the received radio frequency signal; evaluating subject safety based on the extracted radio frequency parameter; and remediating the magnetic resonance excitation responsive to the evaluating indicating a potentially unsafe condition.

In accordance with certain illustrative embodiments shown and described as examples herein, a computer readable medium is disclosed that is programmed with a program that controls a processor to perform the method set forth in the preceding paragraph.

In accordance with certain illustrative embodiments shown and described as examples herein, a magnetic resonance safety monitor is disclosed, comprising: an analyzer configured to (i) receive a radio frequency signal during magnetic resonance excitation, (ii) extract a radio frequency parameter from the received radio frequency signal, and (iii) evaluate subject safety based on the extracted radio frequency parameter; and a remediation module configured to perform a remediation of the magnetic resonance excitation responsive to the evaluation (iii) indicating a potentially unsafe condition.

In accordance with certain illustrative embodiments shown and described as examples herein, a magnetic resonance scanner is disclosed, comprising: a magnet generating a static ($B_0$) magnetic field; a magnetic field gradient system configured to superimpose selected magnetic field gradients on the static magnetic field; a radio frequency system configured to excite and detect magnetic resonance; and a magnetic resonance safety monitor as set forth in the immediately preceding paragraph.

One advantage resides in improved safety during interventional procedures monitored by magnetic resonance imaging.

Another advantage resides in improved safety during magnetic resonance procedures.

Another advantage resides in reduced risk of damage to artifacts examined by a magnetic resonance procedure.

Still further advantages of the present invention will be appreciated to those of ordinary skill in the art upon reading and understand the following detailed description.

BRIEF DESCRIPTION OF THE DRAWINGS

These and other aspects will be described in detail hereinafter, by way of example, on the basis of the following embodiments, with reference to the accompanying drawings, wherein.

DETAILED DESCRIPTION OF EMBODIMENTS

Figure 1:
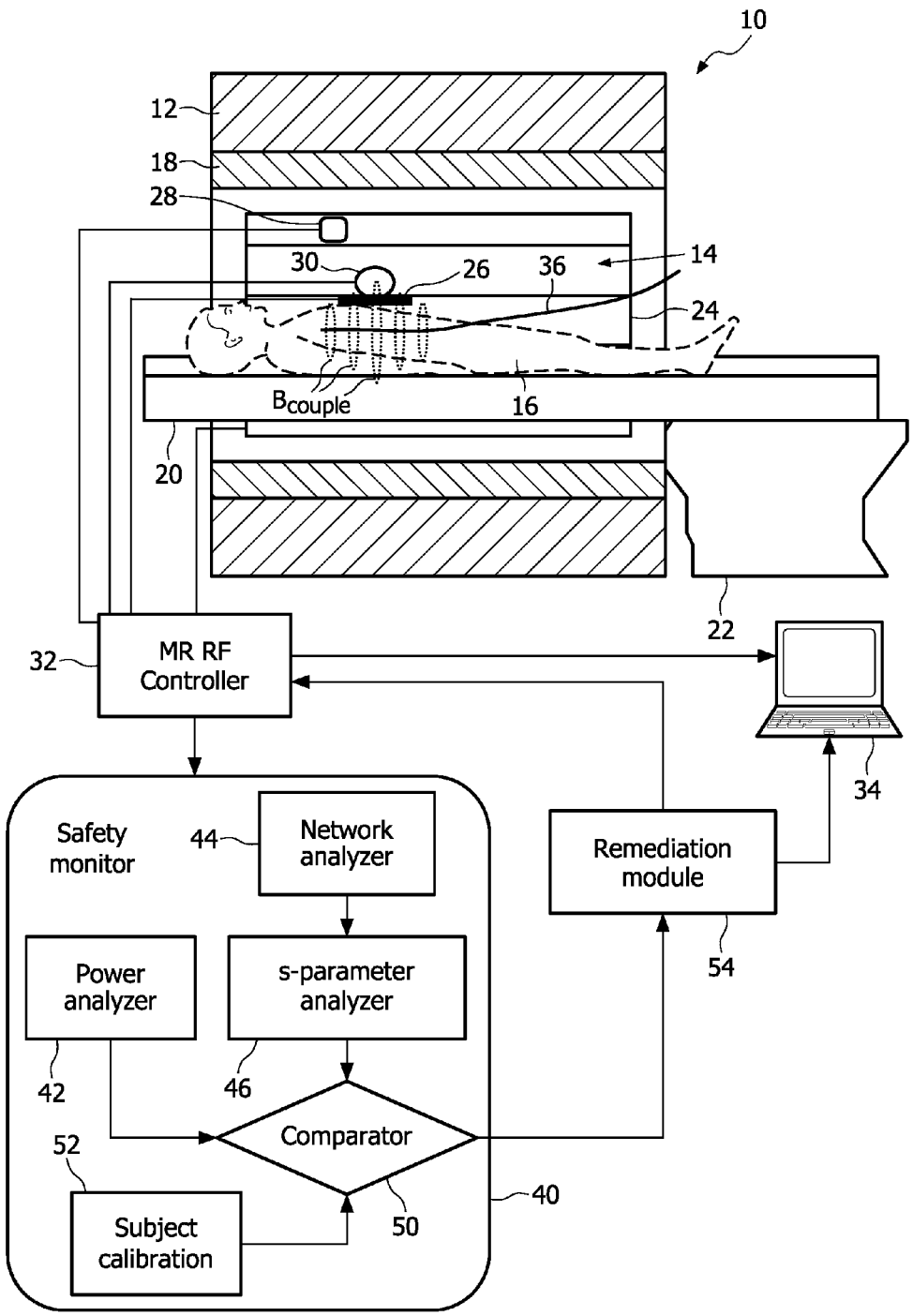
FIG. 1 diagrammatically shows a magnetic resonance scanner system usable to perform an interventional procedure monitored by magnetic resonance imaging, and including a safety monitor to detect a potentially unsafe condition caused by coupling of radio frequency excitation with objects or elements in the examination region.

With reference to FIG. 1, a magnetic resonance scanner 10 includes a main magnet 12 generating a static ($B_0$) magnetic field in an examination region 14 in which is disposed a subject, such as an illustrated human subject 16, for imaging, spectroscopic analysis, or another magnetic resonance procedure. The illustrated magnetic resonance scanner 10 is a horizontal bore type scanner shown in cross section to reveal selected components; however, other types of magnetic resonance scanners can be used.

The magnetic resonance scanner 10 also includes a magnetic field gradient system 18, which may for example include magnetic field gradient coils configured to superimpose selected magnetic field gradients on the static ($B_0$) magnetic field to perform various tasks such as spatially restricting magnetic resonance excitation, spatially encoding magnetic resonance frequency and/or phase, spoiling magnetic resonance, or so forth. Optionally, the magnetic resonance scanner may include other elements not shown in FIG. 1, such as a bore liner, active coil or passive ferromagnetic shims, or so forth. The subject 16 is suitably prepared for a magnetic resonance procedure by being placed on a movable subject support 20 which is then inserted along with the supported subject into the illustrated position for performing the magnetic resonance procedure. For example, the subject support 20 may be a pallet or table that is initially disposed on a couch 22 adjacent the magnetic resonance scanner 10, the subject is placed onto the support 20 and then slidably transferred from the couch 22 into the bore of the magnetic resonance scanner 10.

The magnetic resonance scanner further includes a radio frequency transmit coil 24 that is used to transmit a radio frequency signal at a magnetic resonance frequency in order to perform magnetic resonance excitation. The illustrated radio frequency transmit coil 24 is a whole body quadrature birdcage coil; however, other types of radio frequency transmit coil can be used such as a whole-body transverse electromagnetic (TEM) coil, or a local radio frequency transmit coil such as a head coil, etc. The same radio frequency transmit coil 24, or a different magnetic resonance receive coil 26 is used to measure a magnetic resonance signal generated by the applied radio frequency excitation in a subject in the examination region 14. The illustrated magnetic resonance receive coil 26 is a surface loop coil (seen on edge in FIG. 1); however, other types of receive coils can be used such as an array of surface coils, a limb coil, a head coil, or so forth. The illustrated magnetic resonance scanner 10 also includes two illustrative monitoring loop coils 28, 30. The loop coil 28 is mounted on or near the bore of the scanner 10 for use in selected or monitoring tasks. The monitoring loop coil 30 is a loop coil arranged on or near the subject 16 with its loop transverse to the loop of the magnetic resonance receive loop coil 26. Although the monitoring coils 28, 30 are loop coils, it is also contemplated to use other types of radio frequency coils as receive coils.

As used herein, it is to be appreciated that the term "coil" is intended to encompass coil arrays, SENSE coils, and other multiple receiver elements that are used to excite or measure magnetic resonance. The various radio frequency coils 24, 26, 28, 30 are operated by a magnetic resonance radio frequency controller 32, which may include for example a single channel, quadrature, or multi-channel radio frequency transmitter, a single channel or multi-channel digital receiver, suitable radio frequency switching circuitry for performing operations such as detuning the magnetic resonance receive coil 26 during magnetic resonance excitation, multiplexing connections with various coils 24, 26, 28, 30, or so forth.

During an illustrative interventional magnetic resonance procedure, the magnetic resonance radio frequency controller 32 energizes the radio frequency transmit coil 24 so as to generate a radio frequency signal at the magnetic resonance frequency that excites magnetic resonance in the subject or in a portion of the subject selected by a suitable application of a spatially selective magnetic field gradient by the magnetic field gradient system 18. Optionally, other magnetic field gradients are applied by the gradient system 18 during or after the magnetic resonance excitation to spatially encode or otherwise manipulate the magnetic resonance. If the illustrated magnetic resonance receive coil 26 is provided, it is typically detuned from the magnetic resonance frequency during magnetic resonance excitation to avoid overloading the receive coil 26. During a receive phase, the radio frequency transmit coil 24 or the dedicated magnetic resonance receive coil 26 is tuned to measure the magnetic resonance signal. The measured magnetic resonance signal is stored, processed (for example, by an image reconstruction algorithm in the case of a magnetic resonance imaging procedure), and the image or other results displayed, stored, or otherwise utilized. In the illustrative example of FIG. 1, a computer 34 is programmed or otherwise configured to perform such data processing, storage, and display tasks. In an interventional procedure, an interventional instrument 36 is inserted into the subject 16 to perform a desired interventional operation such as a biopsy extraction, installation of a catheter based temporary pacemaker, installation of a prosthetic device, performance of a vascular angioplasty procedure, or so forth.

The applying of the radio frequency excitation presents the possibility of compromising subject safety (in the case of a human or animal subject) or the possibility of damaging the subject (in the case of an archaeological artifact or other inanimate subject). This can occur if the radio frequency excitation couples with an electrically conductive object in the examination region 14. For example, if the radio frequency excitation couples with the interventional instrument 36 then an electrical current will flow at the excitation frequency in the interventional instrument 36. Such induced electrical current can produce localized heating, electrostatic discharge, or other adverse effects that can cause injury or damage to the subject. In embodiments in which the interventional instrument 36 includes one or more wires or other elongated conductors, such electrical current is likely to flow substantially parallel with or along the elongated conductors. For the illustrative interventional instrument 36, such electrical current produces circumferential magnetic field loops $B_{couple}$ encircling the interventional instrument 36 as diagrammatically shown in FIG. 1. It will be noted that the illustrative monitoring loop coil 30 is positioned to receive a substantial flux from the magnetic field loops $B_{couple}$ so that the monitoring loop coil 30 is inductively well-coupled with the magnetic field loops $B_{couple}$. In other procedures, the radio frequency excitation may unsafely couple with another conductive element or object in the examination region 14, such as with an electronic pacemaker, a metallic prosthetic implant, or so forth.

To detect such a potentially unsafe condition, a safety monitor 40 is provided to monitor the magnetic resonance excitation. The safety monitor 40 can monitor various radio frequency parameters of the applied radio frequency excitation. For example, the bore mounted monitoring loop coil 28, or the monitoring loop coil 30 mounted on or near the subject, can be used as a pickup coil to detect a signal that is input to a power analyzer 42 to generate a signal indicative of the instantaneous radio frequency power generated by the radio frequency transmit coil 24 during the radio frequency excitation. Rather than being coupled to one of the dedicated monitoring coils 28, 30, the power analyzer 42 can be connected with the magnetic resonance receive coil 26. In this latter arrangement, the magnetic resonance receive coil 26 is typically detuned from the magnetic resonance frequency during the application of the radio frequency excitation; however, even in the detuned state, the magnetic resonance receive coil 26 typically detects a residual radio frequency signal responsive to the radio frequency excitation.

Additionally or alternatively, the safety monitor 40 can include or incorporate a network analyzer 44 operatively connected with the radio frequency transmit coil 24 to determine reflection, transmission, or other characteristics of the radio frequency excitation. In some embodiments, the network analyzer 44 outputs one or more s-parameters characterizing the radio frequency excitation, such as reflected power, e.g. an S11 parameter, transmitted power, e.g. an S21 parameter, or so forth. An s-parameter analyzer 46 processes the s-parameters to determine desired information about the radio frequency excitation. For example, the network analyzer 44 optionally measures an S11 parameter and the s-parameter analyzer 46 determines frequency of the radio frequency excitation signal based on the S11 parameter. As another example, the network analyzer 44 optionally measures an S21 parameter and the s-parameter analyzer 46 determines phase of the radio frequency excitation signal based on the S21 parameter.

The monitored radio frequency parameters are compared with a safety criterion by a comparator 50. For example, a rapid decrease in the coupled power indicated by the power analyzer 42 could be indicative of power loss to a resonant circuit within the examination region 14, such as a resonant circuit defined by the interventional instrument 36. An abrupt shift in the frequency or phase of the radio frequency excitation could similarly indicate unsafe coupling with a resonant circuit in the examination region 14. Optionally, the safety criterion is a subject specific safety criterion determined based on a subject calibration 52. If the comparator 50 identifies an unsafe condition based on the comparison, it suitably activates a remediation module 54 which performs a suitable remediation such as terminating the magnetic resonance procedure including any magnetic resonance excitation, or adjusting the magnetic resonance excitation to suppress or eliminate the unsafe condition, or so forth. For example, if the remediation involves aborting the magnetic resonance procedure, then the remediation module 54 may suitably comprise a signal generator outputting an "abort" signal to the magnetic resonance radio frequency controller 32, which causes the magnetic resonance radio frequency controller 32 to terminate radio frequency excitation.

Figure 2:
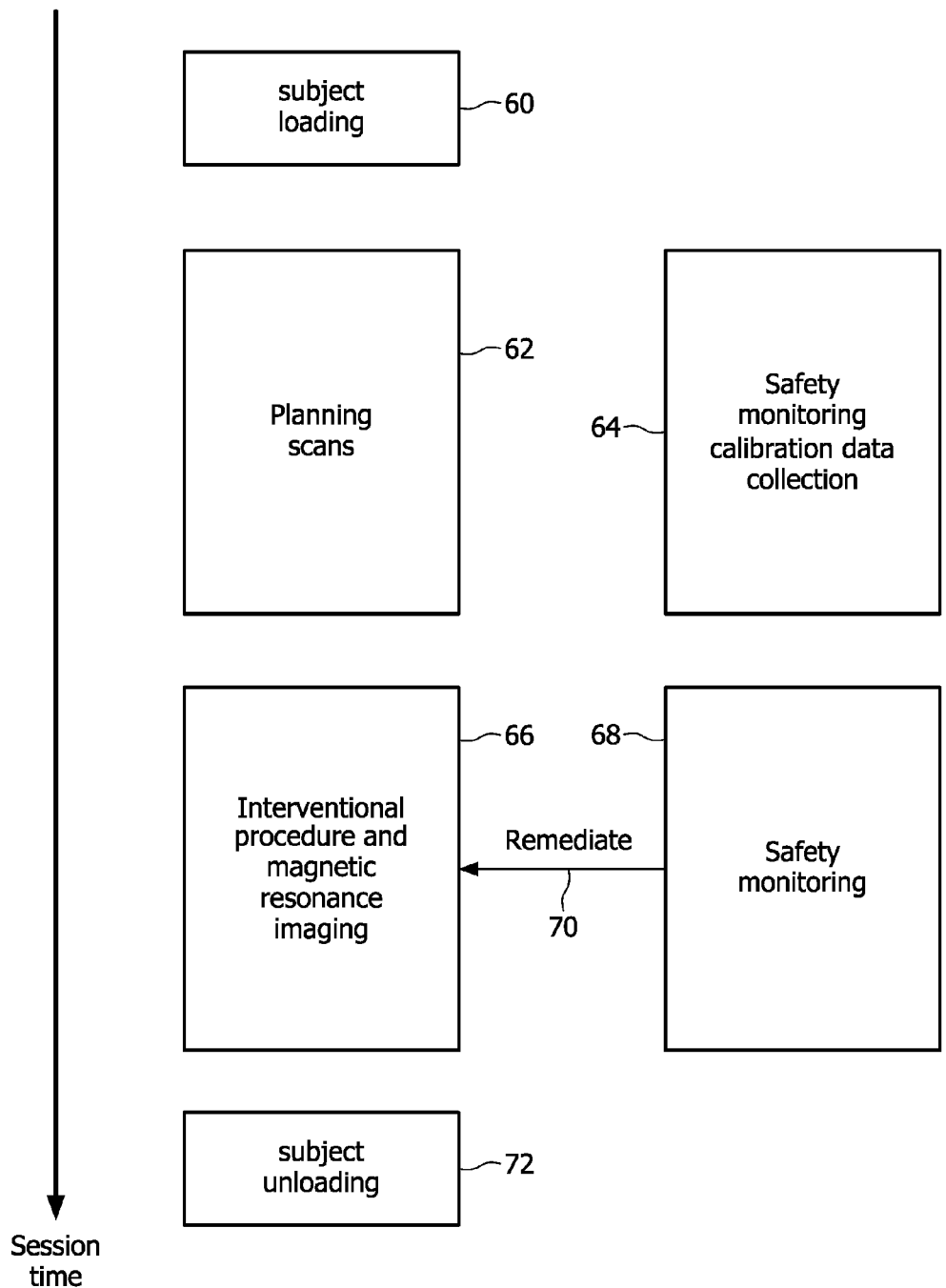
FIG. 2 diagrammatically shows timing aspects of an interventional magnetic resonance procedure carried out using the system of FIG. 1.

With continuing reference to FIG. 1 and with further reference to FIG. 2, the use of the safety monitor 40 and magnetic resonance scanner 10 to monitor an illustrative interventional procedure session is described. The session is initiated by a subject loading operation 60 during which the subject 16 is loaded into the examination region 14 of the magnetic resonance scanner 10. This is followed by a planning scans operation 62 during which the interventional procedure is planned. The planning scans typically entail acquiring proton images of the subject prior to insertion of the interventional instrument 36. The physician or other medical personnel display the acquired planning images on the computer 34 and determine relevant parameters, features, or other aspects such as the target tumor for a biopsy, the location of a vascular stenosis that is to be treated by an angioplasty procedure, locations of critical neighboring organs that should be avoided during the interventional procedure, and so forth. The planning images can also be used to optimize magnetic resonance imaging parameters for the subject of the interventional procedure, so as to ensure good image contrast and other favorable imaging characteristics.

Concurrently with the planning scans operation 62, a safety monitoring calibration data collection operation 64 is optionally performed to generate the subject calibration 52. The calibration data collection operation 64 may, for example, determine the average and standard deviation or other variational parameter descriptive of the power detected by the power analyzer 42 in the absence of insertion of the interventional instrument 36. This provides a baseline power level for comparison with power levels detected for radio frequency excitations performed during the interventional procedure. Similarly, the calibration data collection operation 64 may determine the frequency and phase values and deviations or variations descriptive of the frequency and phase of the radio frequency excitation, so as to provide a baseline for frequency and phase comparison during the interventional procedure. Advantageously, the calibration data collection operation 64 is optionally performed in conjunction with the planning images acquisition, that is, the radio frequency excitations used in acquiring planning images can be treated as calibration radio frequency excitations for the safety monitor 40, and a reference radio frequency parameter or parameters generated by the calibration radio frequency excitations can be measured and analyzed by the safety monitor 40 to generate the subject calibration 52.

Once the interventional procedure planning and optional safety monitoring calibration data collection operations 62, 64 are completed, an interventional procedure and magnetic resonance imaging operation 66 commences, during which the interventional procedure is performed while being monitored by magnetic resonance imaging performed by the magnetic resonance scanner 10. For example, the interventional procedure may entail inserting the interventional instrument 36 into the subject 16 along an insertion trajectory determined a priori out using the planning images. The concurrent magnetic resonance imaging provides the physician or other medical personnel with visual feedback on the precise position of the interventional instrument 36 in the subject 16. Thus, the physician or other medical personnel can "see" using the magnetic resonance images when the tip of the interventional instrument 36 enters the tumor to be biopsied, or can "see" when the tip reaches the stenosis to be widened by angioplasty, or so forth. Once the biopsy sampling, angioplasty, or other interventional task is completed, the physician or other medical personnel can withdraw the interventional instrument 36 from the subject, again using the magnetic resonance imaging to monitor the withdrawal.

Concurrently with the interventional procedure and magnetic resonance imaging operation 66, a safety monitoring operation 68 is performed by the safety monitor 40. This entails monitoring the radio frequency parameter or parameters (e.g., detected power, frequency, and/or phase) during each application of a radio frequency excitation in the examination region 14, and evaluating subject safety based on the monitoring. If the safety monitor 40 detects a potentially unsafe condition, it sends a remediation signal 70 to the interventional procedure and magnetic resonance imaging operation 66. In some embodiments, the remediation signal 70 is directed to the magnetic resonance radio frequency controller 32 to cause an abrupt termination of radio frequency excitation operations. Alternatively, the remediation signal 70 may cause the magnetic resonance radio frequency controller 32 to adjust the radio frequency excitations by lowering the power, adjusting the frequency or phase, or otherwise adjusting the radio frequency excitations to suppress or eliminate the potentially unsafe condition. As yet another additional or alternative response, the remediation signal 70 may be directed to the computer 34 or other display device in order to provide a visual alarm to the physician or other medical personnel indicating the potentially unsafe condition. Such alarm is optionally also accompanied by an audio alarm, flashing light, or other attention signal.

Once the interventional procedure and magnetic resonance imaging operation 66 is complete, the subject is suitably unloaded from the magnetic resonance scanner 10 in a subject unloading operation 72.

Figure 3:
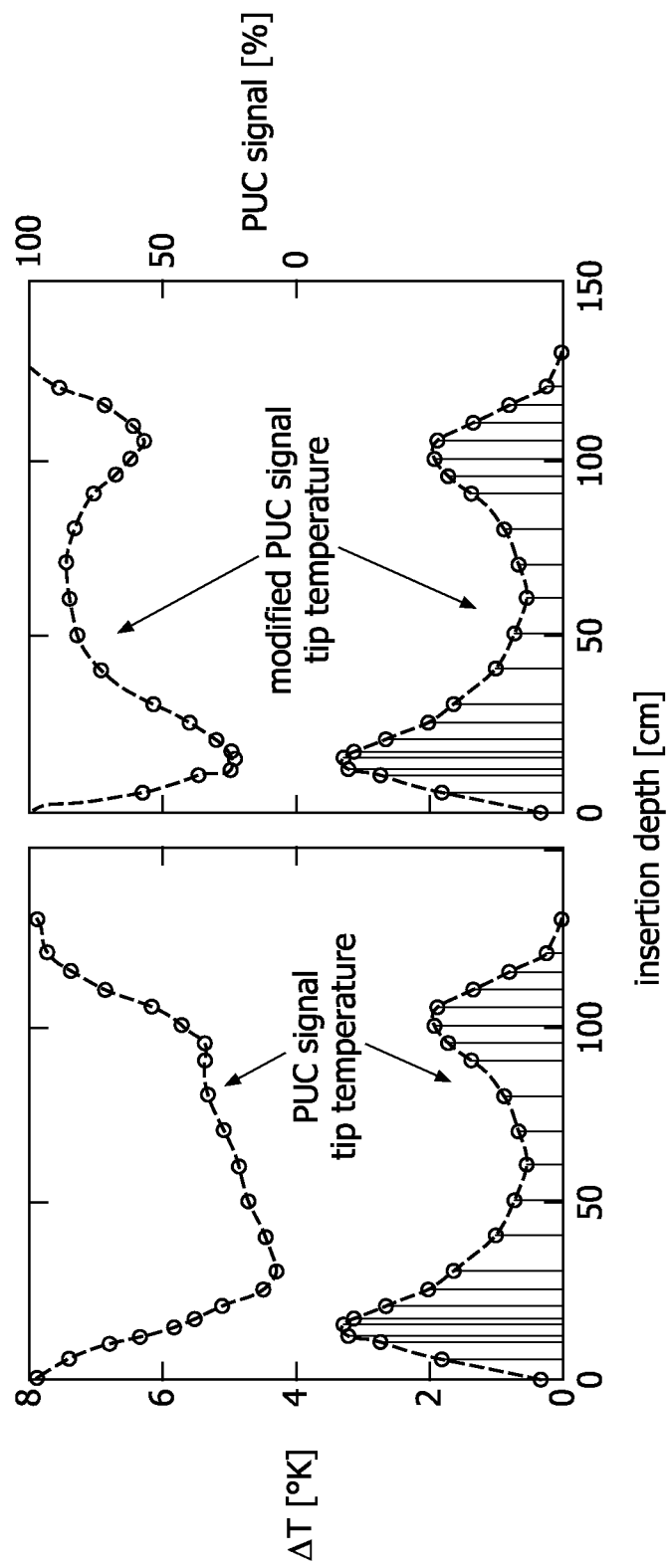
FIG. 3 plots results of a phantom study evidencing effectiveness of the safety monitor of FIG. 1. The left-hand-side plot shows correlation of temperature measurements at a catheter device tip with radio frequency signal strength monitored by an internal pick-up coil (PUC). The right-hand-side plot shows data of the left-hand-side plot after correction for typical power reflection due to detuning of the RF transmit coil.
Figure 4:
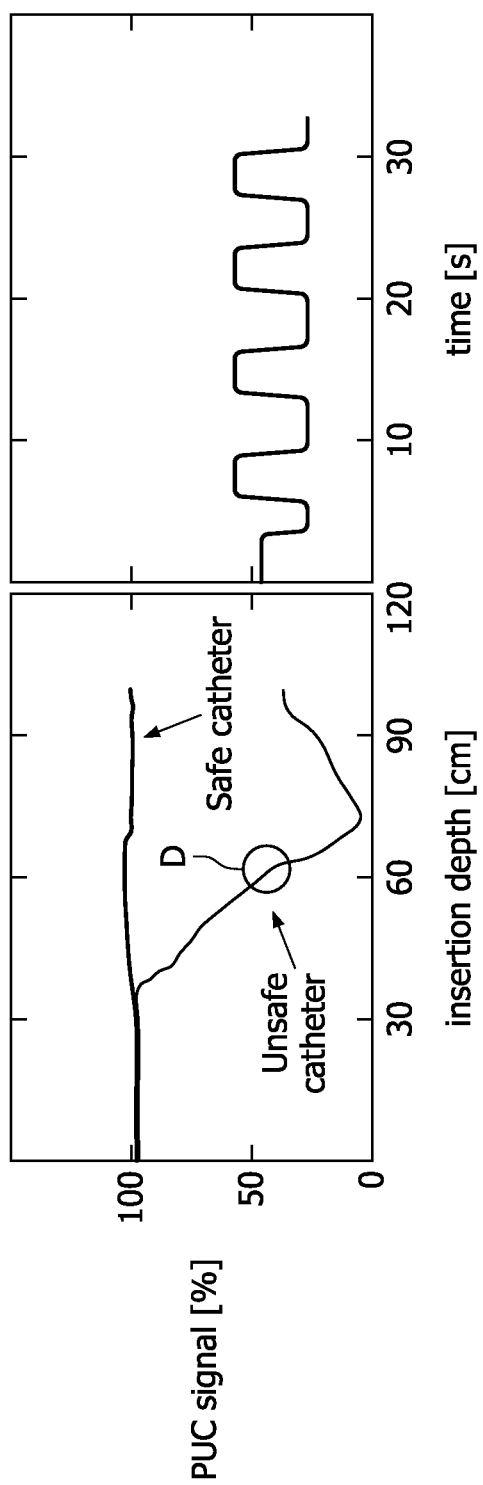
FIG. 4 plots results of a volunteer study evidencing effectiveness of the safety monitor of FIG. 1. The left-hand-side plot plots coupling of the radio frequency signal used in magnetic resonance excitation to a safe catheter and to an unsafe catheter as a function of insertion depth into a volunteer subject. The right-hand-side plot plots tuning and detuning of the unsafe catheter device at the region labeled "D" in the left-hand-side plot caused by intermittently touching the handle of the unsafe catheter device.

With reference to FIGS. 3 and 4, some illustrative experiments evidencing the effectiveness of the disclosed safety monitoring systems and methods are described. FIG. 3 plots results of a phantom study. The left-hand-side plot shows correlation of temperature measurements at a catheter device tip with radio frequency signal strength monitored by an internal pick-up coil (PUC). The right-hand-side plot shows data of the left-hand-side plot after correction for typical power reflection due to detuning of the RF transmit coil. FIG. 4 plots results of a volunteer study. The left-hand-side plot plots coupling of the radio frequency signal used in magnetic resonance excitation to a safe catheter and to an unsafe catheter as a function of insertion depth into a volunteer subject. The right-hand-side plot plots tuning and detuning of the unsafe catheter device at the region labeled "D" in the left-hand-side plot caused by intermittently touching the handle of the unsafe catheter device.

The data shown in FIGS. 3 and 4 were acquired using a 3 Tesla Philips Achieva magnetic resonance scanner (available from Philips Medical Systems, Best, The Netherlands). A safe catheter and an unsafe catheter were used to demonstrate the capability of the safety monitor 40 to automatically detect dangerous radio frequency coupling between the radio frequency excitation and the unsafe catheter during imaging. In the phantom experiment of FIG. 3, the catheters were advanced into a tubular vessel phantom during real-time imaging (Cartesian SSFP, TR=9 ms, TE=3.5 ms, $\alpha=65°$, matrix 172×172, whole body SAR<0.9 W/kg.). A pickup coil mounted near the bore wall (similar, for example, to the monitoring coil 28 of FIG. 1) generated the signals labeled "PUC signal [%]" scaled on the right-hand-side plot of FIG. 3. Simultaneous fiber-optic temperature measurements were acquired using a thermometry system from LumaSense Technologies, Santa Clara, Calif., USA. The temperature and PUC signals were recorded at 22 different positions as plotted in FIG. 3.

In the volunteer experiment, the results of which are summarized in FIG. 4, a volunteer was placed inside the scanner, and the vessel phantom was placed along the arms and on top of the volunteer's breast. Safe and unsafe catheters were advanced during imaging of the volunteer. The volunteer was requested to perform normal respiration and minor movements to imitate a normal compliance level.

Referring to FIG. 3, substantial correlation is visible between temperature measurements and PUC signals at the selected catheter positions. In the left-hand-side plot, power reflections due to detuning of the radio frequency transmit coil 24 were not accounted for. The PUC signal variation results both from power dissipation in the unsafe catheter and also from power reflections. Accordingly, the power signal decrease seen in FIG. 3 with increasing catheter insertion is a conservative measure for potential radio frequency coupling. The right-hand-side plot plots the same data as the left-hand-side plot, except that an estimated typical power reflection behavior is accounted for. The correlation is seen to be even stronger when the power reflection behavior is approximately accounted for.

Referring to FIG. 4, left-hand-side plot, measurements were performed with the volunteer loading the body coil. The unsafe situation presented by use of an unsafe catheter is unambiguously detected. The variation of the PUC signals due to respiration was 3.6% (not shown) compared to up to a 95% decrease in the PUC signal due to radio frequency coupling between the radio frequency excitation and the unsafe catheter. On the other hand, the safe catheter correctly shows no substantial PUC signal decrease. In the safety monitor 40, the power analyzer 42 suitably determines the "100%" level for a given subject during the safety monitoring calibration data collection operation 64, and thereafter compares the power indicated by the power analyzer 42 with this "100%" level. A potentially unsafe condition is suitably defined by a selected percentage decrease of the power signal with respect to the "100%" level. For example if the power level decreases below 80% of the "100%" level this might be taken to indicate a potentially unsafe condition, thus causing the safety monitor 40 to activate the remediation module 54.

The right-hand-side plot of FIG. 4 shows the effect on the PUC signal of repeatedly touching the hand-piece of the unsafe catheter while the catheter is in the position "D" indicated in the left-hand-side plot, i.e. inserted to an insertion depth of about 62 cm where the PUC signal is at about 40% of the "100%" level. The effect of the touching is to change the natural resonance frequency of the unsafe catheter, and this change in resonance frequency is unambiguously seen in the right-hand-side plot of FIG. 4 as a modulation of the order of 20-30% of the "100%" level of the PUC signal. The ability to detect this detuning due to manual handling of the unsafe catheter is of value, because in an interventional procedure the interventional instrument may be tuned well away from the magnetic resonance frequency until the interventional instrument is handled, inserted into the subject, or otherwise manipulated or utilized in a way that changes the natural resonant frequency of the interventional instrument to a value coinciding with the magnetic resonance frequency.

The results of FIGS. 3 and 4 were obtained using a pickup coil mounted on the bore wall, similar to the illustrative monitoring loop coil 28 of FIG. 1. The ability of such a relatively remote coil to detect the unsafe catheter condition, as shown in FIGS. 3 and 4, demonstrates the general effectiveness of the disclosed safety monitoring. However, to provide higher sensitivity to an unsafe condition, it is contemplated to arrange the pickup coil to be in a relatively better position to couple with magnetic field changes induced by an unsafe condition. As shown in FIG. 1, for example, the pickup coil 30 is arranged with its plane transverse to the magnetic flux loops of the coupling field $B_{couple}$ that is expected to be generated by any unsafe induced current flowing along the direction of elongation of the interventional instrument 36. Accordingly, it is expected that the pickup coil 30 may be more sensitive to an unsafe coupling condition relating to the interventional instrument 36 as compared with the bore-wall-mounted monitoring coil 20. In some embodiments, the safety monitor 40 may monitor a plurality of coils, with any one coil detecting a potentially unsafe condition being sufficient for the comparator 50 to trigger the remediation module 54.

On the other hand, in view of the high sensitivity to an unsafe condition indicated by the experiments summarized in FIGS. 3 and 4, it is also contemplated to use the magnetic resonance receive coil 26 as the pickup coil (or as one of the pickup coils) for the safety monitor 40. The magnetic resonance receive coil 26 is typically detuned during the radio frequency excitation phase of magnetic resonance imaging or another magnetic resonance procedure. However, because the radio frequency excitation is typically orders of magnitude stronger than the magnetic resonance signal to be detected, and in further view of the high sensitivity indicated by FIGS. 3 and 4, it is contemplated that the magnetic resonance receive coil 26, even in a detuned state, will provide sufficient residual signal to enable detection of a power decrease during radio frequency excitation indicating a potentially unsafe condition. An advantage of using the magnetic resonance receive coil 26 for the safety monitoring is that the magnetic resonance receive coil 26 is already available and typically located close to the interventional instrument during an interventional procedure.

Although described with some illustrative reference to interventional magnetic resonance imaging and interventional procedures employing interventional instruments, the safety monitoring apparatuses and methods disclosed herein are readily applied to other magnetic resonance procedures and to non-human, animal or inanimate subjects. During imaging of an archaeological artifact, for example, the safety monitor 40 can detect a reduction in the radio frequency excitation power, or a shift in the frequency or phase of the radio frequency excitation, that may be indicative of a potentially unsafe condition in which the radio frequency excitation is coupling with a metallic or other electrically conductive object, element, or feature of the archaeological artifact. The safety monitor 40 can then cause the remediation module 54 to abort the magnetic resonance procedure before damage is done to the archaeological artifact.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A magnetic resonance method comprising:
controlling, with an MR controller, radio frequency transmit coil to excite magnetic resonance in a subject in an examination region by applying first radio frequency excitation signals to induce magnetic resonance signals in the subject in the examination region prior to an interventional procedure performed using an interventional instrument, and applying second radio frequency excitation signals to induce magnetic resonance signals in the subject in the examination region during the interventional procedure performed using the interventional instrument;
receiving the applied radio frequency excitation signals;
evaluating, with a safety monitor, parameters of the received radio frequency excitation signals, wherein the parameters are indicative of electrical coupling with the interventional instrument causing a current to flow in the interventional instrument, wherein a comparison is performed between a parameter acquired from the first radio frequency excitation signals with a parameter acquired from the second radio frequency excitation signals, wherein the comparison is indicative of an overheating condition of the subject in the examination region; and
causing, with the safety monitor, in response to the evaluating of the parameters, the MR controller to automatically at least one of: (1) terminate the applying of the second radio frequency excitation signals or (2) adjust the applying of the second radio frequency excitation signals.

2. The magnetic resonance method as set forth in claim 1, further comprising:
disposing the interventional instrument in the examination region; and
performing the interventional procedure using the interventional instrument;
wherein the applying of the second radio frequency excitation signals and the measuring of the induced magnetic resonance signals is repeated during the interventional procedure to track movement of the interventional instrument.

3. The magnetic resonance method as set forth in claim 2, wherein the applying of the second radio frequency excitation signals is terminated in response to the evaluating of the parameters indicating coupling with the interventional instrument.

4. The magnetic resonance method as set forth in claim 1, further including:
during the applying of the second radio frequency excitation signals, detuning a magnetic resonance receive coil which receives the induced magnetic resonance signal; and
receiving the radio frequency excitation signals using the detuned magnetic resonance receive coil.

5. The magnetic resonance method as set forth in claim 4, wherein the comparison further includes:
comparing a strength of the first received radio frequency excitation signals with a strength of the second received radio frequency excitation signals.

6. The magnetic resonance method as set forth in claim 1, wherein the parameters include one or more of a resonance frequency of the radio frequency excitation signals, a phase of the radio frequency excitation signals, and one or more s-parameters of the radio frequency excitation signals.

7. A magnetic resonance method comprising:
controlling, prior to performing an interventional procedure, magnetic resonance excitation coils of a magnetic resonance apparatus to transmit radio frequency excitation signals into a subject, and, with a safety monitor, receiving external to the subject radio frequency magnetic resonance excitation signals transmitted into the subject by magnetic resonance excitation coils to induce magnetic resonance;
controlling, during the interventional procedure on the subject performed using an interventional instrument in an examination region, magnetic resonance excitation coils of the magnetic resonance apparatus to transmit radio frequency excitation signals into a subject, and, with the safety monitor, receiving external to the subject radio frequency magnetic resonance excitation signals transmitted into the subject by magnetic resonance excitation coils to induce magnetic resonance;
repeatedly evaluating, with the safety monitor, parameters of the magnetic resonance excitation signals, the parameters being indicative of electrical coupling with the interventional instrument that causes a current to flow in the interventional instrument, wherein evaluating the parameters includes comparing at least one of a phase and a frequency of the magnetic resonance excitation signals transmitted prior to the interventional procedure with the phase and frequency of the magnetic resonance excitation signals transmitted during the interventional procedure; and
causing, with the safety monitor, in response to the evaluating of the parameters, an MR controller to automatically at least one of: (1) terminate the transmission of the magnetic resonance excitation signals, or (2) adjust the applying of the magnetic resonance excitation signals.

8. The magnetic resonance method as set forth in claim 7, further including:
during transmission of the magnetic resonance excitation signals, detuning a magnetic resonance receive coil and wherein the detuned magnetic resonance receive coil receives the magnetic resonance excitation signals.

9. A magnetic resonance method comprising:
receiving external to a subject, during an interventional procedure on the subject performed using an interventional instrument in an examination region with a safety monitor, radio frequency magnetic resonance excitation signals transmitted into the subject by magnetic resonance excitation coils to induce magnetic resonance;
repeatedly evaluating, with the safety monitor, parameters of the magnetic resonance excitation signals, the parameters being indicative of electrical coupling with the interventional instrument that causes a current to flow in the interventional instrument, wherein evaluating the parameters of the magnetic resonance excitation signals includes detecting at least one of a change in frequency, phase, or strength of the magnetic resonance excitation signals in comparison with a predetermined baseline; and
causing, with the safety monitor, in response to the evaluating of the parameters, an MR controller to automatically at least one of: (1) terminate the transmission of the magnetic resonance excitation signals, or (2) adjust the applying of the magnetic resonance excitation signals.

* * * * *